United States Patent
Kastura

(10) Patent No.: US 6,723,979 B2
(45) Date of Patent: Apr. 20, 2004

(54) ROLL ARMING SENSOR

(75) Inventor: John L. Kastura, Kokomo, IN (US)

(73) Assignee: Delphi Technologies, Inc, Troy, MI (US)

(*) Notice: Subject to any disclaimer, the term of this patent is extended or adjusted under 35 U.S.C. 154(b) by 106 days.

(21) Appl. No.: 09/793,452

(22) Filed: Feb. 27, 2001

(65) Prior Publication Data

US 2002/0117385 A1 Aug. 29, 2002

(51) Int. Cl.⁷ .................................................. G01D 5/34
(52) U.S. Cl. ........................ 250/231.1; 33/366.23; 73/514.19
(58) Field of Search ............................ 250/221, 231.1, 250/231.11, 231.12, 559.37, 231.13–231.19; 356/248, 250–254; 33/366.23, 366.11, 366.12, 366.24; 73/514.19, 514.26, 546; 280/734, 735; 180/268, 282

(56) References Cited

U.S. PATENT DOCUMENTS 5,013,909 A * 5/1991 Sondergeld et al. ..... 250/231.1
6,202,488 B1 * 3/2001 Cash ........................ 73/514.26

OTHER PUBLICATIONS

"SCHMIDT® Tilting Sensor BS 13.011" SCHMIDT Feintechnik GmbH, Germany, 8 pages, no date.

* cited by examiner

*Primary Examiner*—Thanh X. Luu
(74) *Attorney, Agent, or Firm*—Robert M. Sigler; Stefan V. Chmielewski

(57) ABSTRACT

A roll arming sensor is provided for determining an arming signal for use on a vehicle for rollover detection. The roll arming sensor includes a light source for generating a light beam and a receiver for detecting the light beam. Disposed substantially horizontal between the light source and receiver are first and second cylindrical members, both oriented substantially parallel to the longitudinal axis of the vehicle. The first and second cylindrical members each have a window extending therethrough for passing the light beam during normal vehicle travel. Each of the first and second cylindrical members are movable to a second position upon experiencing an armed condition, such as a roll event, to prevent the optical beam from passing to the receiver, thereby generating an arming signal for use with a rollover sensor.

19 Claims, 2 Drawing Sheets

ROLL ARMING SENSOR

TECHNICAL FIELD

The present invention generally relates to roll (tilt) sensors and, more particularly, to an electromechanical roll arming sensor, particularly for use in arming devices for deployment of occupant protection devices upon detecting a potential rollover condition for a vehicle.

BACKGROUND OF THE INVENTION

Automotive vehicles are increasingly employing safety-related devices that deploy in the event that the vehicle experiences a rollover so as to provide added protection to the occupants of the vehicle. For example, upon detecting an anticipated vehicle rollover condition, a pop-up roll bar can be deployed such that, when activated, the roll bar further extends vertically outward to increase the height of support provided by the roll bar during a rollover event. Other controllable features may include actuating deployment of one or more airbags, such as front and side airbags, or actuating pretensioners to pretension restraining devices, such as seatbelts or safety harnesses, to prevent occupants of the vehicle from ejecting from the vehicle or colliding with the roof of the vehicle during a rollover event.

In the past, mechanical-based rollover sensors have been employed in automotive vehicles to measure the angular roll position of the vehicle from which a rollover condition can be determined. The mechanical sensors have included the use of a pendulum normally suspended vertically downward due to the Earth's gravitational force. Many mechanical automotive sensing devices are employed simply to monitor the angular position of the vehicle relative to a level ground horizontal orientation. As a consequence, the basic automotive vehicle rollover sensors have generally been susceptible to error when the vehicle travels around a corner or becomes airborne, in which case the Earth's gravitational force, which the sensor relies upon, may be overcome by other forces.

More sophisticated rollover sensing approaches have been considered which employ a plurality of sensors, a microprocessor for processing the sensed signals according to one or more software algorithms, and communication lines between the microprocessor and deployable devices. Such approaches require as many as six sensors, including three accelerometers and three angular rate sensors. The three accelerometers generally provide lateral, longitudinal, and vertical acceleration measurements of the vehicle. The three angular rate sensors, also referred to as gyros, measure pitch rate, roll rate, and yaw rate.

In commercial applications, many sophisticated rollover sensing approaches also employ a safing device, such as an arming sensor, to provide an independent verification of an actual rollover event and prevent inadvertent deployment of devices due to a possible failure of any of the sensors, the microprocessor, the software algorithms, and the signal communication lines. Conventional arming sensors have included the use of a Schmidt tilt switch which employs a tilting cone vertically disposed relative to the vehicle and aligned with the vertical gravity vector. An optical light beam is generated by an infrared diode. An optical path formed within the tilting cone is aligned to allow the light beam to travel from the infrared diode to a phototransistor during normal vehicle travel. Upon experiencing a sufficient roll angle or roll rate, the tilting cone tilts relative to the vertical orientation to prevent the light beam from passing to the phototransistor, thereby generating an arming signal for use in allowing a rollover deployment to occur.

While the use of a Schmidt tilt switch as an arming sensor has served satisfactorily for some applications, this type of conventional arming sensor is susceptible to some false arming conditions. For example, the conventional tilt switch is generally responsive to non-roll forces, such as those caused by vehicle braking (deceleration) and those experienced during a free-fall of the vehicle, which may occur during normal routine driving with little or no possibility of a rollover. In addition, some conventional arming sensors are generally expensive.

Accordingly, it is therefore desirable to provide for an affordable and accurate roll arming sensor for arming devices for deployment upon detecting a rollover event for a vehicle. More particularly, it is desirable to provide for a roll arming sensor that is affordable and accurate for detecting when the vehicle experiences a minimum roll angle that is sufficient to serve as an arming signal.

SUMMARY OF THE INVENTION

In accordance with the teachings of the present invention, a roll arming sensor is provided. The roll arming sensor includes a housing defining a first cavity, a source for generating a signal beam, such as a light emitting diode, and a receiver for detecting the signal beam. A first cylindrical member is disposed substantially horizontal within the first cavity and between the source and receiver. When used on a vehicle, the first cylindrical member is oriented substantially parallel to the longitudinal axis of the vehicle and is configured to roll substantially perpendicular to the longitudinal axis of the vehicle upon experiencing a sufficient roll angle. The first cylindrical member has a window extending therethrough and is located in a first position during a non-armed condition such that the signal beam passes through the window. The first cylindrical member is movable to a second position during an armed condition. In the second position, the window is positioned to prevent the signal beam from reaching the receiver, thereby generating an arming signal at an output.

Accordingly, the present invention advantageously provides for a cost effective roll arming sensor that achieves enhanced reliability. The roll arming sensor is particularly useful for arming one or more devices for deployment by a rollover detection apparatus for use in a vehicle.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
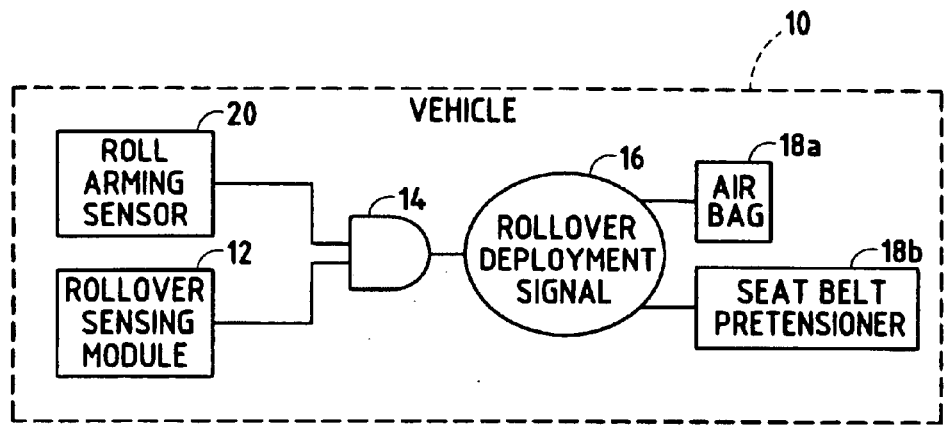
FIG. 1 is a block diagram of a vehicle employing a rollover sensor and a roll arming sensor.

Referring to FIG. 1, a rollover sensing module 12 and roll arming sensor 20 are illustrated for use in generating a rollover deployment signal 16 for deploying one or more devices upon detecting an anticipated overturn (e.g., rollover) event for a vehicle 10. The rollover sensing module 12 and roll arming sensor 20 of the present invention are preferably mounted on the automotive vehicle 10 and oriented to detect, in advance, an anticipated future rollover condition of the vehicle and initiate responsive action. A vehicle rollover condition, as described herein in connection with the present invention, may include side-to-side rotation of the vehicle about the longitudinal axis of the vehicle, commonly referred to as a "vehicle rollover," and back-to-front rotation about the lateral axis of the vehicle, commonly referred to as a "vehicle pitchover," or a combination of rollover and pitchover. For purposes of describing the rollover detection herein, the term "rollover" is generally used to refer to either a rollover condition or a pitchover condition.

The rollover sensing module 12 may include a conventional sensing module for sensing vehicle dynamics and detecting a rollover condition of the vehicle. Upon detecting a vehicle rollover condition, the rollover sensing module 12 provides an output signal, which is indicative of the detected rollover condition, to one input of a logic AND gate 14. The other input of the logic AND gate 14 is coupled to the output of the roll arming sensor 20. The logic AND gate 14 provides the rollover deployment signal 16 when both the rollover sensing module 12 and the roll arming sensor 20 produce outputs indicative of a possible vehicle rollover event. The logic AND gate 14 may be implemented in analog circuitry or via digital processing.

The rollover deployment signal 16 may be supplied to one or more selected vehicle devices, such as a passenger air bag 18, or other safety-related devices, to actuate the selected devices in anticipation of an upcoming rollover event. In addition, the rollover deployment signal 16 may be employed to deploy a pop-up roll bar to provide extended lateral support to the occupants of the vehicle just prior to the actual occurrence of the vehicle rollover event. Similarly, the rollover deployment signal may actuate an occupant restraining device, such as a seatbelt or harness safety pretensioner, to eliminate slack in the restraining device just prior to the vehicle rollover event occurring. Other devices may likewise be controlled in response to the rollover deployment signal 16.

Figure 2:
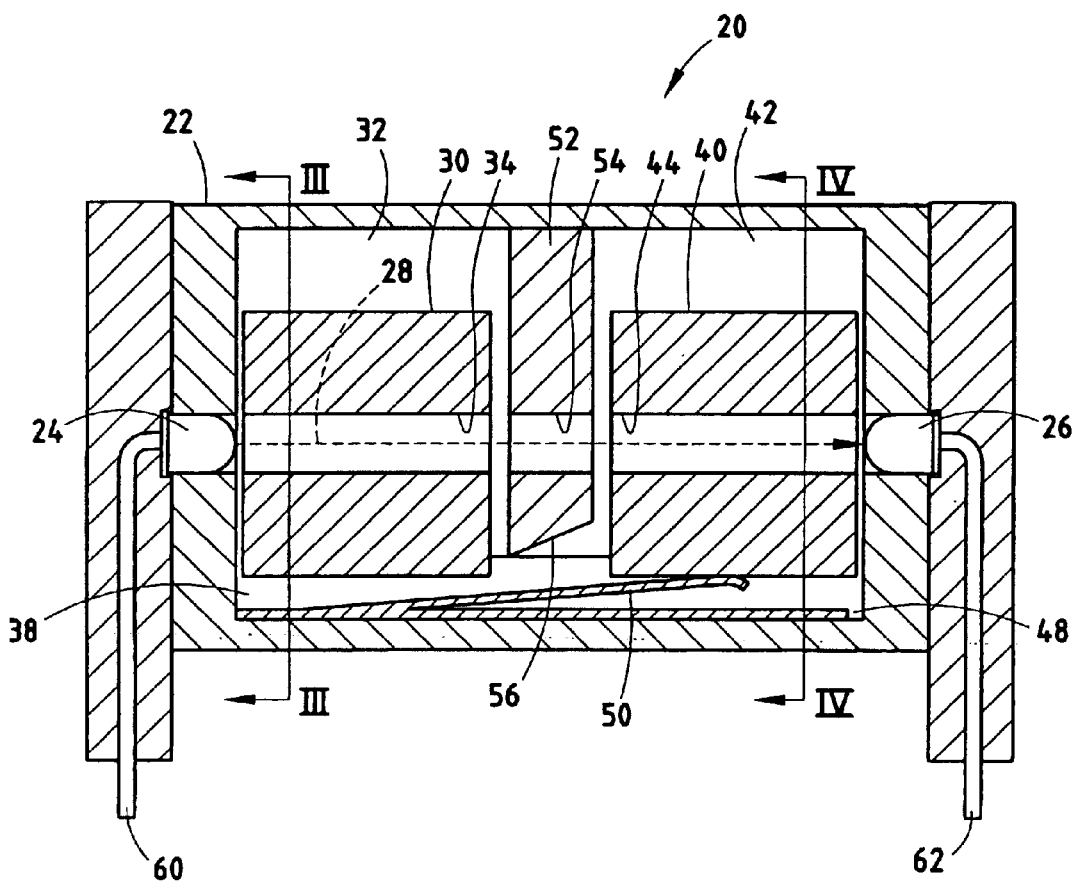
FIG. 2 is a cross-sectional view taken through the central longitudinal axis of a roll arming sensor according to the present invention.

Referring to FIG. 2, a roll arming sensor 20 is illustrated therein in a cross-sectional view. Roll arming sensor 20 generally includes a housing 22 defining a first cavity 32 and a second cavity 42. The housing includes a dividing wall 52 disposed between first and second cavities 32 and 42, respectively. Disposed within the first cavity 32 is a first cylindrical member 30 which has a cylindrical hole (window) 34 centrally formed therein along the longitudinal axis of member 30. Disposed within the second cavity 42 is a second cylindrical member 40. The second cylindrical member 40 likewise has a cylindrical hole (window) 44 centrally formed therein along the longitudinal axis of member 40. The first and second cylindrical members are oriented substantially horizontal relative to the ground plane.

The dividing wall 52 also has a cylindrical hole (window) 54 extending between the first and second cavities 32 and 42 and located so as to align with the holes 34 and 44 of first and second cylindrical members 30 and 40, respectively, when positioned in the non-armed state. In addition, the bottom surface of dividing wall 52 has an inclined bottom edge 56. A bias spring 50 is disposed in channels 38 and 48 below respective first and second cylindrical members 30 and 40. The bias spring provides a bias force applied vertically upward against second cylindrical member 40 to oppose the force of gravity, thus reducing the total amount of downward force applied to member 40. It should be appreciated that the tapered bottom edge 56 of dividing wall 52 allows the bias spring 52 to extend to a raised vertical position.

The roll arming sensor 20 includes a light emitting diode (LED) 24 disposed at one end of housing 22, within first cavity 32, for generating an optical light beam. At the opposite end of housing 22, within sealed cavity 42, is a phototransistor 26 for sensing optical light. The LED 24 produces an optical light beam in response to an input signal received at input 60. In the non-armed state, the optical light beam passes through holes (windows) 34, 44, and 54 along the path shown by dashed line 28 and is received and sensed at the phototransistor 26. The optical path 28 is substantially parallel to the longitudinal axis of the first and second cylindrical members 30 and 40. In addition, when detecting roll about the longitudinal axis of a vehicle, the first and second cylindrical members 30 and 40 are oriented substantially parallel to the longitudinal axis of the vehicle. Phototransistor 26 generates an output signal in response to receiving the light beam. The output signal is made available at output 62. According to one embodiment, the output signal is a voltage signal that exceeds a minimum threshold during a non-armed condition, and the voltage signal is less than the minimum threshold upon detecting an armed condition.

Figure 3A:
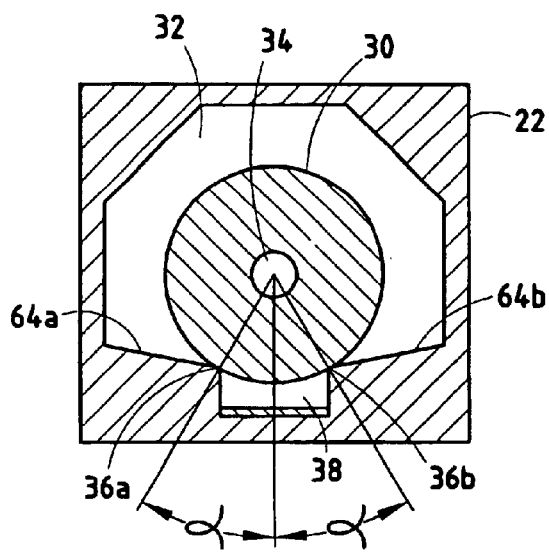
FIG. 3A is a cross-sectional view taken through lines III—III in FIG. 2 illustrating the first cylindrical member of the roll arming sensor in a non-armed position.
Figure 3B:
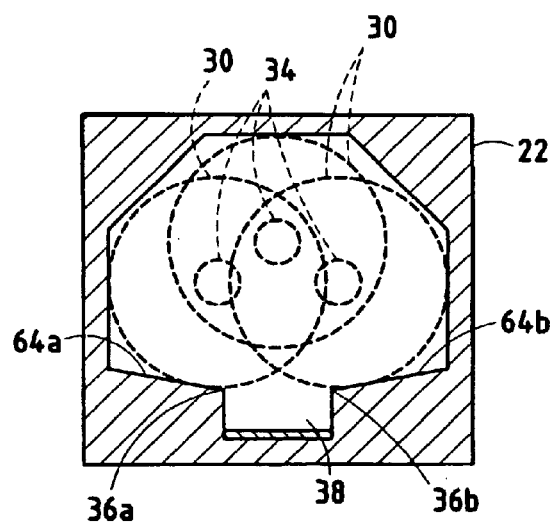
FIG. 3B is a cross-sectional view taken through lines III—III in FIG. 2 illustrating the first cylindrical member of the roll arming sensor in several armed positions.

FIGS. 3A and 3B further illustrate the first cylindrical member 30 of roll arming sensor 20 during a non-armed driving condition and during armed driving conditions, respectively. In FIG. 3A, the first cylindrical member 30 rests on a pair of parallel mechanical stops 36a and 36b which position the first cylindrical member 30 centered over channel 38 when the vehicle roll angle is less than or equal to angle α. According to one embodiment, angle α is equal to thirty degrees, so that when the vehicle roll angle exceeds thirty degrees relative to a horizontal plane, the first cylindrical member 30 is expected to roll onto either angled surface 64a or angled surface 64b and into an armed position such as is shown in FIG. 3B. In addition to sensing a roll in excess of angle α, the first cylindrical member 30 may become elevated during a vehicle free-fall or rollover such that it contacts the upper interior walls of the first cavity 32. Whenever the cylindrical member 30 departs from the initial non-armed position centered above channel 38 and moves to an armed position against the side or upper interior walls of first cavity 32, the hole 34 likewise moves to a new position so as to block the light beam from passing between LED 24 and phototransistor 26.

Figure 4A:
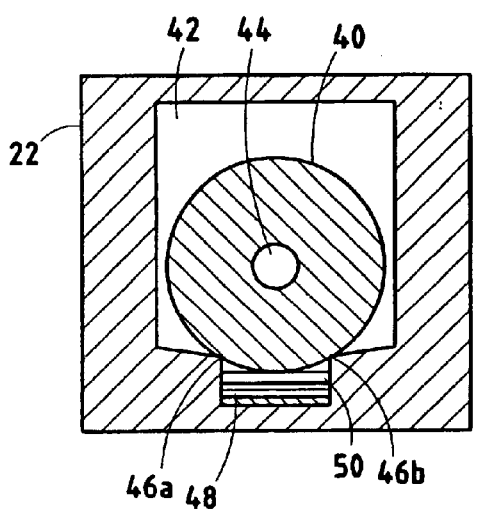
FIG. 4A is a cross-sectional view taken through lines IV—IV in FIG. 2 illustrating the second cylindrical member of the roll arming sensor in a non-armed position.
Figure 4B:
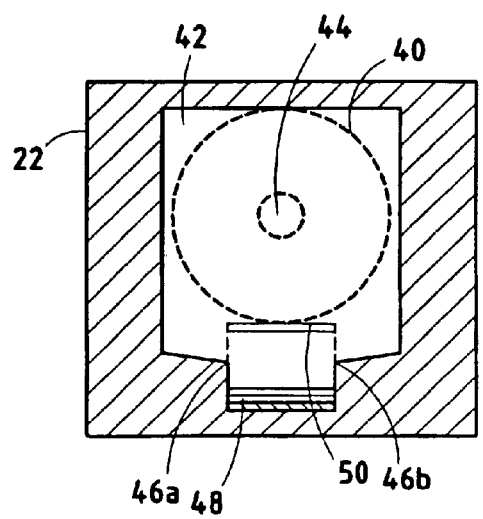
FIG. 4B is a cross-sectional view taken through lines IV—IV in FIG. 2 illustrating the second cylindrical member of the roll arming sensor in an armed position.

The second cylindrical member 40 is further illustrated in FIGS. 4A and 4B during a non-armed condition and an armed condition, respectively. As shown in FIG. 4A, the second cylindrical member 40 rests on a pair of parallel mechanical stops 46a and 46b, which position the second cylindrical member 40 centered over channel 48. In addition, bias spring 50 provides a bias force vertically upward from below second cylindrical member 40 so as to reduce the net amount of force applied downward due to gravity. The bias spring 50 ensures that for a vehicle free-fall situation, the cylinder member 40 is forced to a position where the light path is broken. According to one embodiment, the bias spring 50 is designed so that when the combination of vertical acceleration and gravity is less than 0.26 g the bias spring 50 will begin to move the second cylindrical member 40 vertically upward. When this occurs, the second cylindrical member 40 moves vertically upward towards the upper interior surface of cavity 42, as shown in FIG. 4B, thereby displacing the hole 44 to an armed position that blocks the passage of the optical light beam between LED 24 and phototransistor 26.

The use of the first cylindrical member 30 advantageously detects the presence of vehicle roll beyond angle α, but the position of the first cylindrical member is indeterminate for a vehicle free-fall. The use of the second cylindrical member 50 biased by bias spring 50 advantageously allows for the detection of the vehicle moving in a free-fall motion. It should be appreciated that when the vehicle returns to a normal driving condition in which the vehicle is at an angle of less than angle α (e.g., thirty degrees) and the vehicle is not experiencing a free-fall driving motion, the first and second cylindrical members 30 and 40 will return to the normal non-armed positions as shown in FIGS. 3A and 4A.

Accordingly, the electromechanical roll arming sensor 20 of the present invention detects vehicle events, such as a vehicle roll angle (tilt), beyond a threshold angle, or free-fall events, during which certain deployment devices are armed ready to deploy in the event that an anticipated rollover event is determined. This allows for a redundancy check prior to deploying safety-related devices on a vehicle. The roll arming sensor 20 provides an independent verification of an actual roll event to prevent inadvertent deployment due to failure of the rollover sensor(s), processing unit, software algorithms, or communication lines. It should be appreciated that the roll arming sensor 20 of the present invention provides enhanced accuracy roll arming detection at low cost.

It will be understood by those who practice the invention and those skilled in the art, that various modifications and improvements may be made to the invention without departing from the spirit of the disclosed concept. The scope of protection afforded is to be determined by the claims and by the breadth of interpretation allowed by law.

What is claimed is:

1. An electromechanical roll sensor comprising:
    a housing defining a first cavity;
    a source for generating a signal beam;
    a receiver for detecting the signal beam:
        a first cylindrical member disposed substantially horizontal within the first cavity between the source and the receiver and having a first window extending therethrough, wherein said first cylindrical member is located in a first position during a non-armed condition such that the signal beam passes through the first window, and said first cylindrical member is movable to a second position during an armed condition such that the signal beam is prevented from passing through the first window to the receiver, wherein the first cylindrical member is movable to the second position by rolling on an inclined surface;
        a second cylindrical member disposed substantially horizontal within a second cavity in said housing between said source and said receiver and having a second window for allowing said signal beam to pass therethrough, wherein the second cylindrical member is located in a first position during a non-armed condition such that the signal beam passes through the second window, and said second cylindrical member is movable to a second position during an armed condition such that the signal beam is prevented from passing through the second window; and
        an output for generating an arming signal when said signal beam is prevented from passing to the receiver.

2. The roll sensor as defined in claim 1, wherein said signal beam comprises an optical light beam.

3. The roll sensor as defined in claim 2, wherein said source comprises a light emitting diode and said receiver comprises a phototransistor.

4. The roll sensor as defined in claim 1, wherein said first cylindrical member moves to the second position during a roll event exceeding an angular threshold.

5. The roll sensor as defined in claim 1, wherein said second cylindrical member is biased by a bias spring to detect vertical forces.

6. The roll sensor as defined in claim 1, wherein said roll sensor is located on a vehicle to detect a potential roll-over condition of the vehicle.

7. The roll sensor as defined in claim 6, wherein said roll sensor generates an arming signal for use with a vehicle rollover sensor.

8. The roll sensor as defined in claim 1 wherein said sensor detects when said first cylindrical member exceeds a roll angle greater than about thirty degrees relative to a gravity vector.

9. An electromechanical roll sensor for use in determining an arming signal for rollover detection about a longitudinal axis of a vehicle, said sensor comprising:
    a housing defining a first cavity;
    a light source for generating a light beam;
    a receiver for detecting the light beam:
        a first cylindrical member disposed substantially horizontal within the first cavity and oriented substantially parallel to the horizontal axis of the vehicle, wherein said first cylindrical member is located between the source and receiver and having a window extending therethrough for passing the light beam during a non-armed driving condition, and said first cylindrical member is movable to a second position during an armed driving condition to prevent the light beam from passing to the receiver;
        a second cylindrical member disposed substantially horizontal within a second cavity in said housing between said light source and said receiver, wherein said second cylindrical member includes a window for allowing said light beam to pass therethrough when the second cylindrical member is in a first position during a non-armed driving condition, and preventing said light beam from passing to said receiver when the second cylindrical member is in a second position during an armed driving condition; and
        an output for generating an arming signal when the light beam is prevented from passing to the receiver.

10. The sensor as defined in claim 9, wherein said light source comprises a light emitting diode and said receiver comprises a phototransistor.

11. The sensor as defined in claim 9, wherein said second cylindrical member is biased by a spring to detect vertical forces.

12. The sensor as defined in claim 9, wherein said first cylindrical member moves to the second position during a roll event that exceeds an angular threshold.

13. An electromechanical roll arming sensor comprising:

a housing defining a first cavity and a second cavity;

a source for generating a signal beam;

a receiver for detecting the signal beam:

a first cylindrical member disposed substantially horizontal within the first cavity between the source and receiver and having a first window extending therethrough, wherein said first cylindrical member is located in a first position during a non-armed condition so that the signal beam passes through the first window, and said first cylindrical member is movable to a second position during an armed condition to prevent the signal beam from passing to the receiver;

a second cylindrical member disposed substantially horizontal within the second cavity between the source and the receiver and having a second window extending therethrough, wherein said second cylindrical member is located in a first position during a non-armed condition so that said signal beam is able to pass through the second window, and the second cylindrical member is movable to a second position during an armed condition to prevent the signal beam from passing to the receiver; and an output for generating an arming signal when said signal beam is prevented from passing to the receiver during an armed condition.

14. The roll arming sensor as defined in claim 13, wherein said signal beam comprises an optical light beam.

15. The roll arming sensor as defined in claim 14, wherein said source comprises a light emitting diode and said receiver comprises a phototransistor.

16. The roll arming sensor as defined in claim 13, wherein said first cylindrical member moves to the second position during a roll event exceeding an angular threshold, and said second cylindrical member detects a free-fall condition.

17. The roll arming sensor as defined in claim 13, further comprising a bias spring for biasing the second cylindrical member to detect a free-fall condition.

18. The roll arming sensor as defined in claim 13, wherein said roll arming sensor generates an arming signal for use with a vehicle rollover sensor.

19. A roll sensor comprising:

a housing defining a first cavity and a second cavity;

a source for generating a signal beam;

a receiver for detecting the signal beam;

a first member disposed within the first cavity between the source and receiver and having a first window extending therethrough, wherein said first member is located in a first position during a non-armed condition so that said signal beam passes through the first window, and said first member is movable to a second position during an armed condition to prevent the signal beam from passing to the receiver;

a second member disposed within the second cavity between the source and the receiver and having a second window extending therethrough, wherein said second member is located in a second position during a non-armed condition so that said signal beam is able to pass through the second window, and the second member is movable to a second position during an armed condition to prevent the signal beam from passing to the receiver; and an output for generating a roll signal when said signal beam is prevented from passing to the receiver during the armed condition.

* * * * *